(12) United States Patent
Zhang et al.

(10) Patent No.: US 7,053,403 B1
(45) Date of Patent: May 30, 2006

(54) IRIDIUM OXIDE NANOSTRUCTURE

(75) Inventors: Fengyan Zhang, Vancouver, WA (US); Gregory M. Stecker, Vancouver, WA (US); Robert A. Barrowcliff, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 11/339,876

(22) Filed: Jan. 26, 2006

Related U.S. Application Data

(60) Division of application No. 11/013,804, filed on Dec. 15, 2004, which is a continuation-in-part of application No. 10/971,280, filed on Oct. 21, 2004, which is a continuation-in-part of application No. 10/971,330, filed on Oct. 21, 2004.

(51) Int. Cl.
*H01L 29/10* (2006.01)
*H01L 29/12* (2006.01)

(52) U.S. Cl. ......................... 257/43; 438/734
(58) Field of Classification Search ............. 257/43; 438/734

See application file for complete search history.

(56) References Cited

OTHER PUBLICATIONS

Reui-san Chen, Growth of IrO2 Films and Nanorods by means of CVD: An Example of Composition and Morphological Control of Nanostructures, Nov. 11, 2002, Chemical Vapour Deposition 2003, 9, No. 6, pp. 301-305.*

* cited by examiner

*Primary Examiner*—W. David Coleman
*Assistant Examiner*—Nicholas J. Tobergte
(74) *Attorney, Agent, or Firm*—Law Office of Gerald Maliszewski; Gerald Maliszewski

(57) ABSTRACT

A method is provided for patterning iridium oxide (IrOx) nanostructures. The method comprises: forming a substrate first region adjacent a second region; growing IrOx nanostructures from a continuous IrOx film overlying the first region; simultaneously growing IrOx nanostructures from a non-continuous IrOx film overlying the second region; selectively etching areas of the second region exposed by the non-continuous IrOx film; and, lifting off the IrOx nanostructures overlying the second region. Typically, the first region is formed from a first material and the second region from a second material, different than the first material. For example, the first material can be a refractory metal, or refractory metal oxide. The second material can be SiOx. The step of selectively etching areas of the second region exposed by the non-continuous IrOx film includes exposing the substrate to an etchant that is more reactive with the second material than the IrOx.

16 Claims, 5 Drawing Sheets

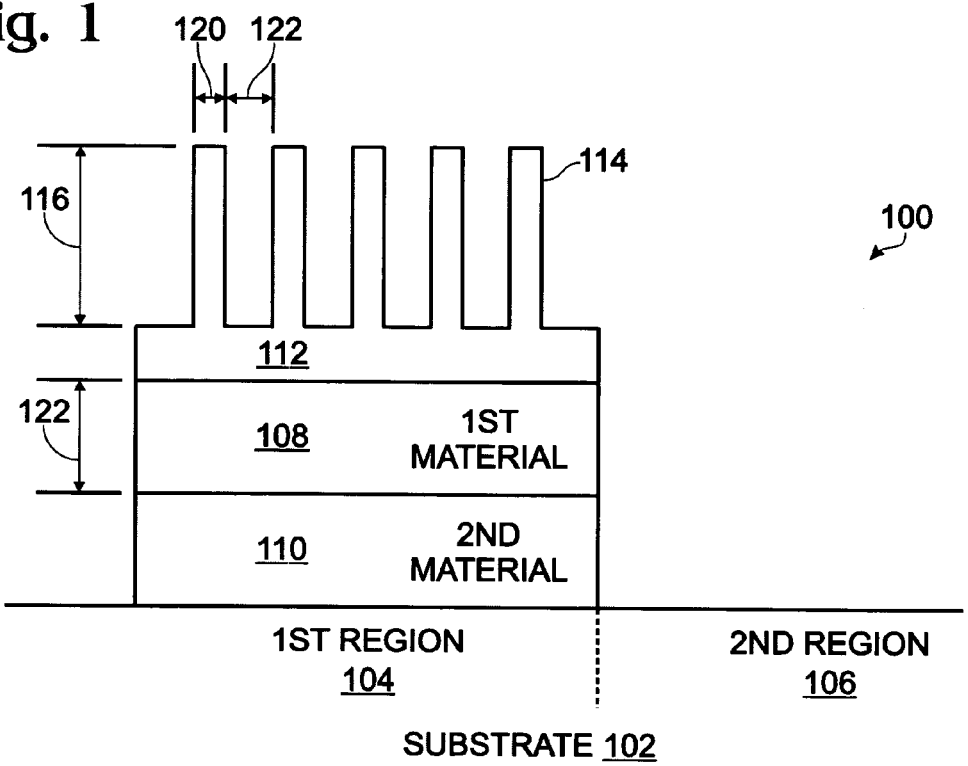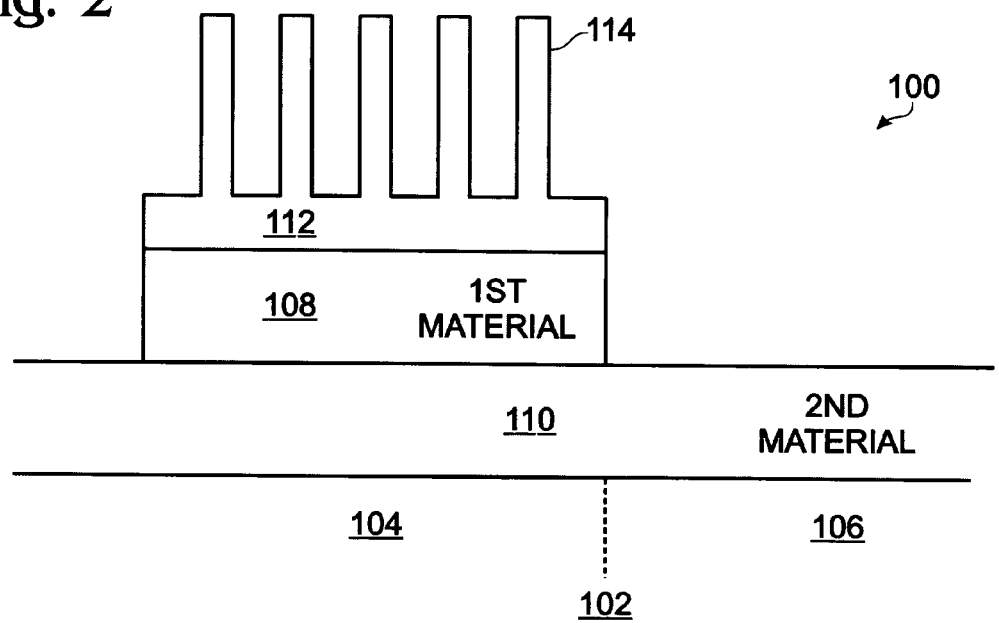

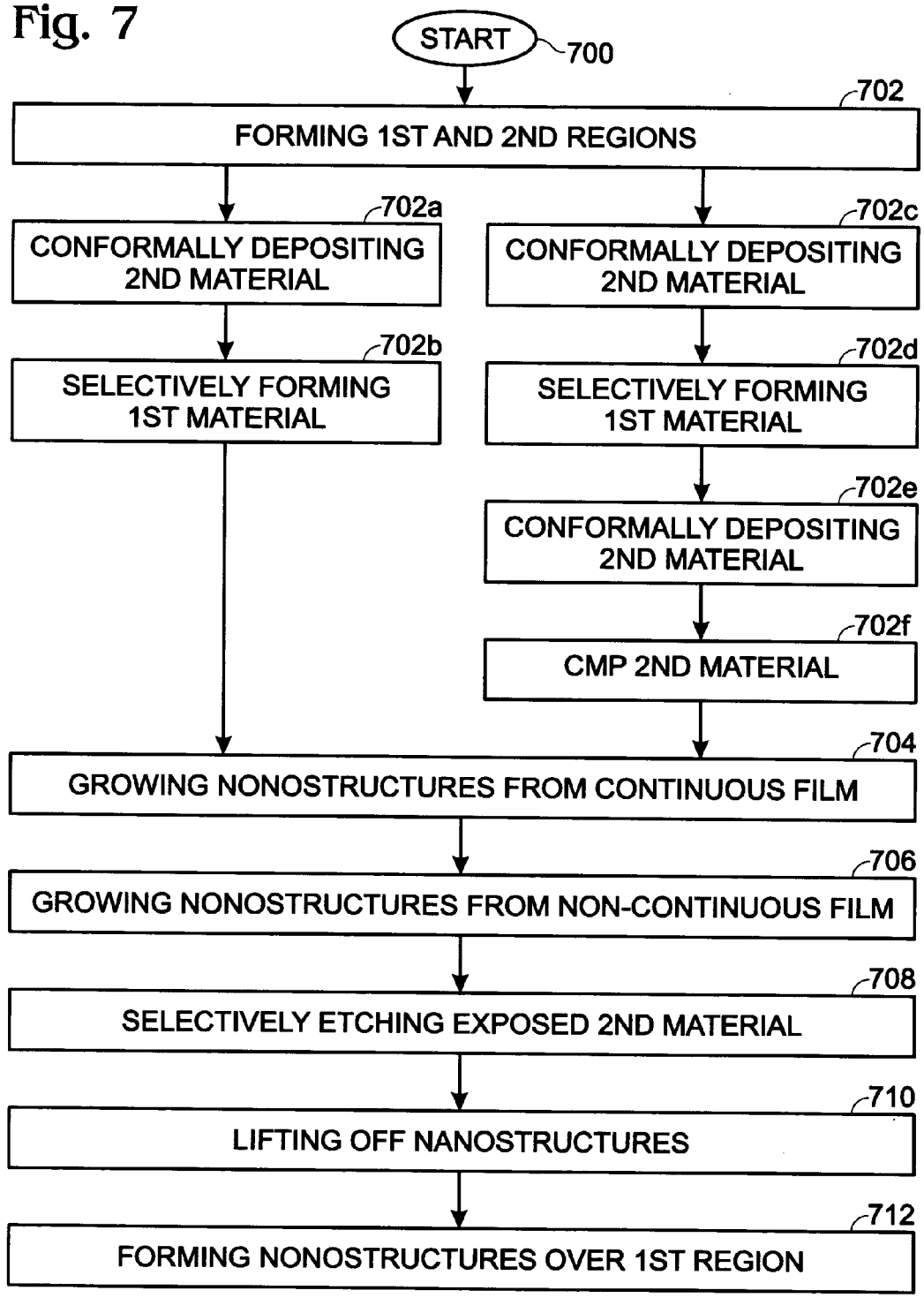

IRIDIUM OXIDE NANOSTRUCTURE

RELATED APPLICATIONS

This application is a Divisional of a pending patent application entitled, IRIDIUM OXIDE NANOSTRUCTURE PATTERNING, invented by Zhang et al., Ser. No. 11/013,804, filed Dec. 15, 2004.

This application is a continuation-in-part of a pending patent application entitled, IRIDIUM OXIDE NANOTUBES AND METHOD FOR FORMING SAME, invented by Zhang et al., Ser. No. 10/971,280, filed Oct. 21, 2004.

This application is a continuation-in-part of a pending patent application entitled, IRIDIUM OXIDE NANOWIRE AND METHOD FOR FORMING SAME, invented by Zhang et al., Ser. No. 10/971,330, filed Oct. 21, 2004.

All of the above-mentioned applications are incorporated herein by reference.

BACKGROUND OF THE INVENTION

1. Field of the Invention

This invention generally relates to integrated circuit (IC) fabrication and, more particularly, to patterned iridium oxide nanostructures and an associated fabrication process.

2. Description of the Related Art

Recently, the fabrication of nanostructures has been explored, due to its potential importance as a building block in nano, microelectromechanical (MEM), and nanoelectromechanical NEM device applications. For example, researchers associated with Charles Lieber have reported the synthesis of a variety of semiconductor nanowires made from materials such as silicon (Si), Si-germanium (SiGe), InP, and GaN, and use in building nano-computing system. Other groups have reported using templates structures to grow metallic nanowires made of materials such as Ni, NiSi, Au, and Pt. Metallic nanowires can be used as interconnections and the sharp tips of the nanowire make them effective for field emission purpose. $ZnO_2$ nanowires are potentially useful as a light emission element.

$IrO_2$ is a conductive metal oxide that is already widely used in DRAM and FeRAM applications. $IrO_2$ can be used as a conductive electrode, as it has stable electrical and chemical properties, even at high temperature $O_2$ ambient conditions. $IrO_2$ can also be used as pH sensor material. Ir thin film can be deposited using PVD easily with excellent polycrystalline structure and strong (111) orientation. $IrO_2$ can be formed afterwards, by oxidizing the Ir film, or it can be formed directly using reactive sputtering method at higher temperatures in oxygen ambient. CVD methods have recently been developed to grow Ir and $IrO_2$ thin films. It is relatively easy to maintain good composition control in CVD processes, and the method is know to provide good step coverage on some materials.

No processes had been previously reported that are able to form metallic nanowires without the use of porous material forms or templates. The templates add a considerable degree of complexity to the process. Thus, a more practical and commercially feasible means of forming metallic nanowires publications is desirable. To that end, the above-mentioned Related Applications describe the growth of iridium oxide ($IrO_2$) nanostructures formed using a metalorganic chemical vapor deposition (MOCVD) method without a template. The Related Applications describe an efficient MOCVD process for forming nanotips and nanorods. Using these MOCVD processes, $IrO_2$ has been successfully grown on Ti, TiN, TaN and $SiO_2$ substrates. The growth length, density, and vertical orientation can be controlled by temperature, pressure, flow, substrates, and time.

It would be advantageous if iridium oxide nanostructures, however formed, could be selectively formed or patterned on a substrate.

It would be advantageous if iridium oxide nanostructures could be selectively formed on a substrate, taking advantage of the differences in characteristics of adjoining substrate materials.

It would be advantageous if iridium oxide nanostructures could be selectively formed on a substrate, taking advantage of the differences in the manner in which iridium oxide covers adjoining substrate materials.

SUMMARY OF THE INVENTION

Now that it has been shown that nanotips and nanorods can be efficiently formed using conventional CMOS processes, the next step is to investigate means of forming practical iridium oxide nanotip structures. To that end, this application describes a process for patterning $IrO_2$ nanorods, so that they can be seamlessly integrated into CMOS, IC, and liquid crystal display (LCD) devices.

Accordingly, a method is provided for patterning iridium oxide (IrOx) nanostructures. The method comprises: forming a substrate first region adjacent a second region; growing IrOx nanostructures from a continuous IrOx film overlying the first region; simultaneously growing IrOx nanostructures from a non-continuous IrOx film overlying the second region; selectively etching areas of the second region exposed by the non-continuous IrOx film; lifting off the IrOx nanostructures overlying the second region; and, in response to lifting off the IrOx nanostructures overlying the second region, forming a substrate with nanostructures overlying the first region.

Typically, the first region is formed from a first material and the second region from a second material, different than the first material. For example, the first material can be a refractory metal, or refractory metal oxide. The second material can be SiOx.

The step of selectively etching areas of the second region exposed by the non-continuous IrOx film includes exposing the substrate to an etchant that is more reactive with the second material than the IrOx. For example, if the first material is a refractory metal and the second material is SiO2, then HF or buffered oxide etches (BOE) are suitable etchants.

In one aspect, the step of forming a substrate first region adjacent a second region includes: conformally depositing the second material overlying the first and second regions; and, selectively forming the first material overlying the second material in the first region. In a second aspect, the step of forming a substrate first region adjacent a second region includes: conformally depositing the second material overlying the first and second regions; selectively forming the first material with a surface overlying the second material in the first region; conformally depositing the second material overlying the first and second regions; and, chemical-mechanical polishing (CMP) the second material to the level of the first material surface.

Additional details of the above-described method and a corresponding patterned substrate with IrOx nanostructures are described below.

BRIEF DESCRIPTION OF THE DRAWINGS

FIG. 1 is a partial cross-sectional view of a patterned iridium oxide (IrOx) nanostructure substrate.

FIG. 2 is a partial cross-sectional view of a variation of the patterned substrate of FIG. 1.

FIG. 7 is a flowchart illustrating a method for patterning IrOx nanostructures.

DETAILED DESCRIPTION

Figure 3A:
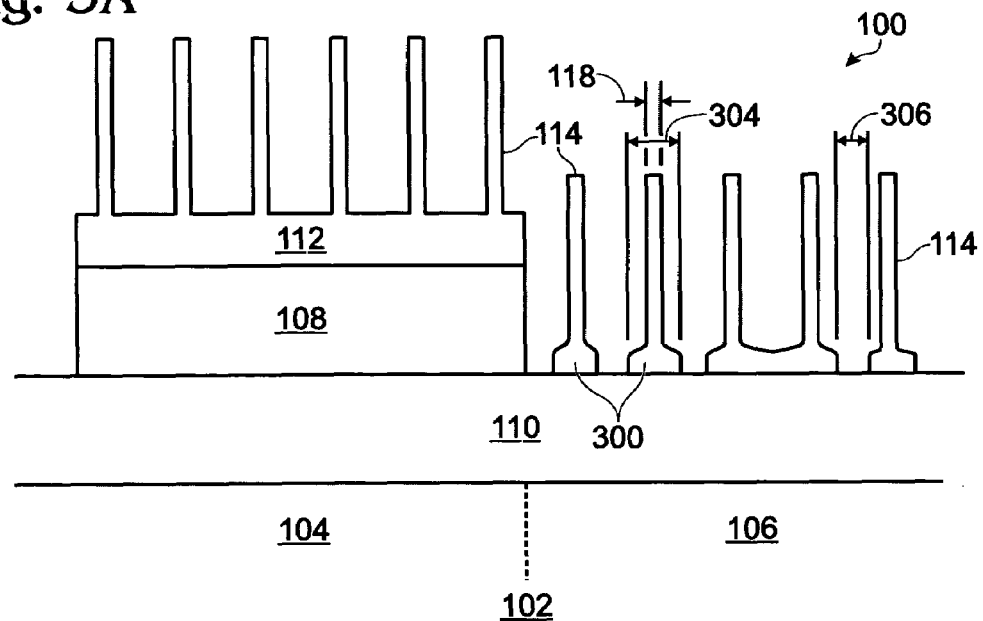
FIGS. 3A and 3B are partial cross-sectional and plan views, respectively, of the patterned substrate of FIG. 1 in a prior process step.

FIG. 1 is a partial cross-sectional view of a patterned iridium oxide (IrOx) nanostructure substrate. The patterned substrate 100 comprises a substrate 102 with a first region 104 and a second region 106 adjoining the first region 104. A first material 108 overlies a second material 110 in the first region 104. A continuous IrOx film 112 with grown IrOx nanostructures 114, having an aspect ratio in the range of 1:1 to 100:1, overlies the first material 108.

An "aspect ratio" is defined herein to be the length 116 of the nanostructures 114 with respect to the nanostructure diameter 118. IrOx is defined herein to be any iridium oxide compound, where "x" is any value between (and including) the values of zero and 2. In another aspect, the "x" value in the continuous IrOx film 112 is different than the "x" value in the nanostructures. For example, the continuous IrOx film 112 can be Ir (x=0), while the nanostructures 114 are IrOx, where x is greater than zero.

Typically, the first material 108 is different than the second material 110. For example, the first material can be Ti, TiN, TaN, Ta, Nb, W, or WN. More generally, the first material 108 can be a refractory metal or a refractory metal oxide. Typically, the second material 110 is SiOx, where "x" is any value greater than zero and less than, or equal to 2. Note, the patterned substrate 100 is not necessarily limited to just the listed materials. It is expected that other materials with similar properties can also be used.

FIG. 2 is a partial cross-sectional view of a variation of the patterned substrate of FIG. 1. In this aspect, the second material 110 overlies both the first region 104 and the second region 106 of the substrate 102. The first material 108 is formed overlying the second material 110 in the first region 104 of the substrate.

Specifically referencing FIG. 1, although the same analysis can also be applied to FIG. 2, IrOx nanostructures 114 grown from the continuous IrOx film 112 overlying the first region 104 have a diameter 118 in the range between 10 and 1000 nm, a length 116 in the range between 10 nm and 10 microns, and a spacing 120 in the range between 10 and 1000 nm. In one aspect, the first material 108 has a thickness 122 in the range of 1 to 100 nanometers (nm). It should be understood that above-described patterned substrate can be formed with a wide variety of grown nano-type IrOx structures, regardless of whether they are called nanotips, nanowires, nanotubes, or nanorods. Typically, nanorods are understood to be rod structures that do not have to have a sharp tip. Nanotips do not have to have rod shape; they can be any shape with a sharp tip. Likewise, the patterned substrate is not necessarily limited to just the above-mentioned exemplary nanostructure dimensions.

Note, although the nanostructures 114 are shown as having relatively uniform lengths, diameters, and spacings, the variation is length 116 can be between 100 nm to 10 microns, the variation in diameter 118 can be between 10 nm and 1000 nm, and the variation in spacing 120 can be between 10 nm and 10 microns.

Figure 3B:
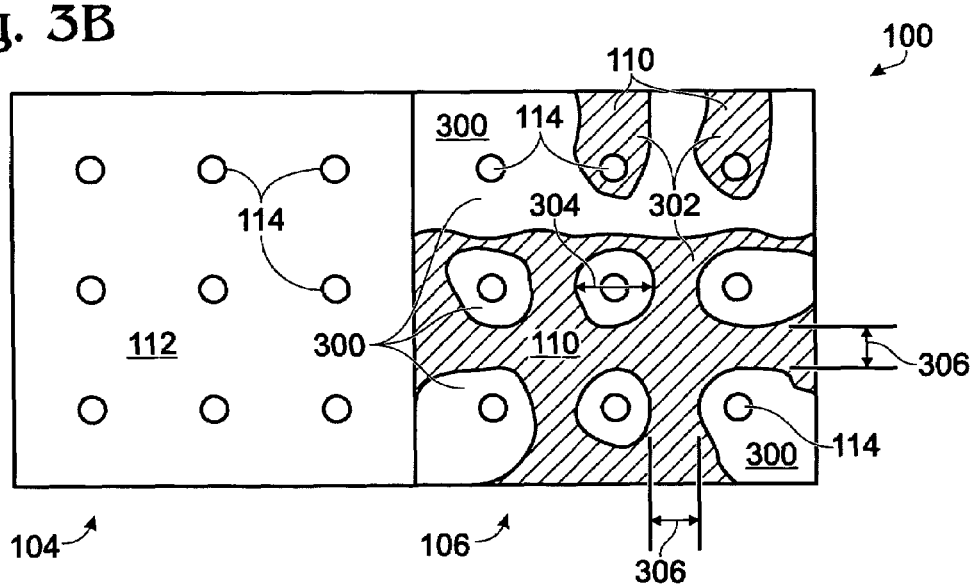

FIGS. 3A and 3B are partial cross-sectional and plan views, respectively, of the patterned substrate of FIG. 1 in a prior process step. In one aspect seen in FIG. 3A, a non-continuous IrOx film 300, with grown IrOx nanostructures 114, temporarily overlies the second material 110. As shown, the nanostructures 114 are shown as having been grown from a collection of non-continuous "island" structures. However, in other aspects, the diameters 118 of at least some of the nanostructures 114 can be equal to island diameters 304. That is, the non-continuous film areas 304 can be defined by the nanostructures diameter 118. If a large percentage of the film areas are defined by nanostructure diameters, then "the non-continuous film with grown IrOx nanostructures" maybe alternately be considered to be a discontinuous filed of IrOx nanostructures. Also as shown, not all the film area need necessarily be non-continuous.

The non-continuous IrOx film 300 includes non-continuous zones 302 in the film having an area (shown in cross-hatch, see FIG. 3B) in the range between 100 $nm^2$ and 100 $microns^2$, and a spacing 306 between zones 302 in the range between 10 and 5000 nm. The significance of the above-mentioned non-continuous film 300 is described below.

Although not specifically shown here, the non-continuous IrOx film, with nanostructures, can be formed as a prior process step in the fabrication of the structure of FIG. 2. The details of a damascene patterned structure are essentially the same as the details shown in FIGS. 3A and 3B (see FIGS. 6A and 6B).

FUNCTIONAL DESCRIPTION

Figure 4A:
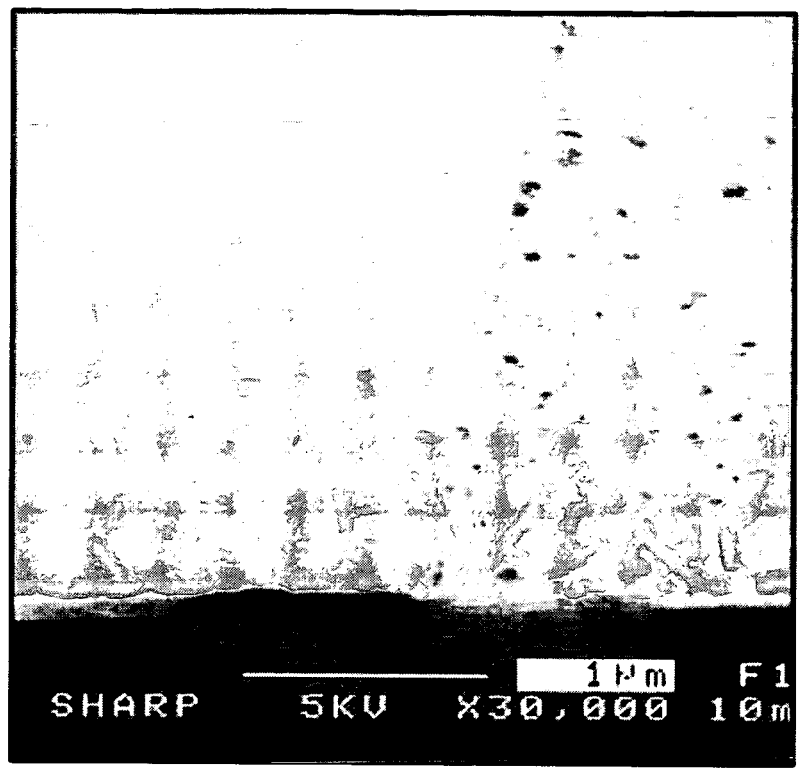
FIGS. 4A and 4B are scanning electron microscope (SEM) photographs depicting the growth of $IrO_2$ on different substrate materials.
Figure 4B:
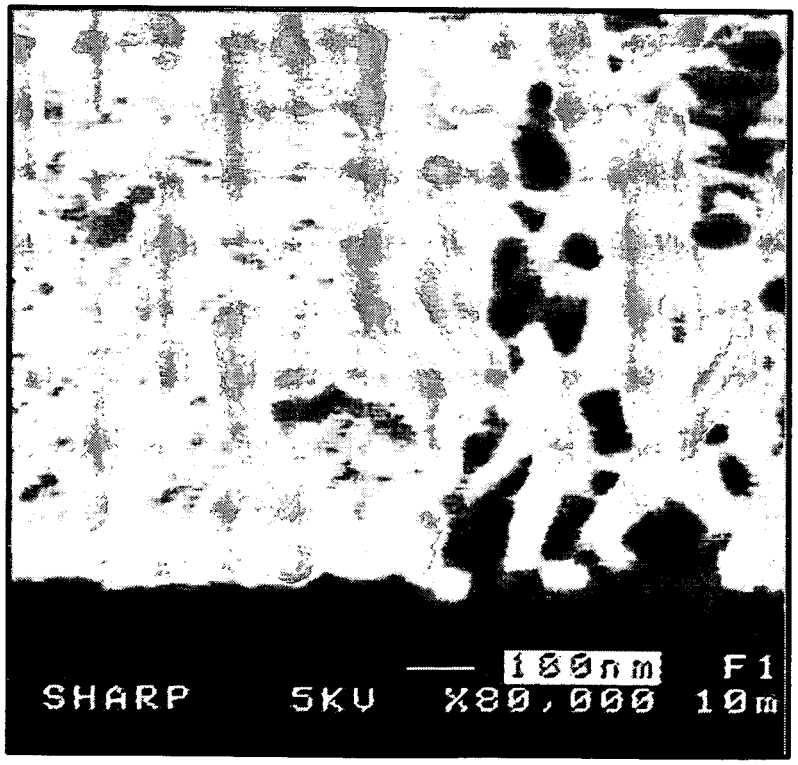

FIGS. 4A and 4B are scanning electron microscope (SEM) photographs depicting the growth of IrO2 on different substrate materials. As can be seen, the growth mechanism is different for the two substrates. The material of the left in each figure is TiN, the material on the right is SiO2. FIG. 4B is a higher magnification than FIG. 4A.

Substrates made with a thin layer of Ti, TiN, or TaN, with a thickness range from 1 nm to 100 nm, promote the growth of a continuous Ir—IrO2 film. IrO2 nanorods are grown on the Ir—IrO2 film. With the adjoining SiO2 substrate, the IrO2 nanorods grow directly on the SiO2 surface. Alternately stated, a continuous Ir—IrO2 need not be formed between the SiO2 layer and the nanostructures. The spaces between the nanorods on SiO2 make it possible for etching chemicals, such as HF solutions, to attack the underneath SiO2 layer and lift off the overlying IrO2 nanorods.

Figure 5A:
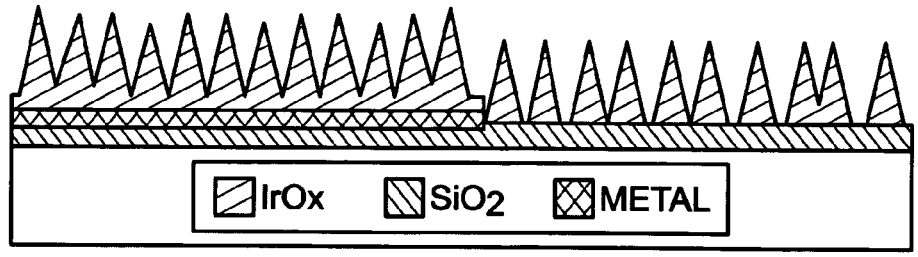
FIGS. 5A and 5B depict a first method for selectively etching off the IrO2 nanorods.
Figure 5B:
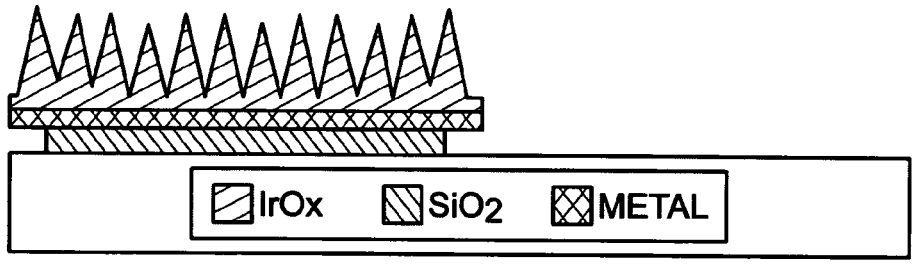

FIGS. 5A and 5B depict a first method for selectively etching off the IrO2 nanorods. The first material (i.e., TiN, TaN, Ti, Ta, Nb, W, or WN) is patterned. The IrO2 nanorods are grown on the wafer, then the wafer is dipped in an HF solution for just enough time to lift off the IrO2 nanorod without sacrificing too much of SiO2 layer. This technique may cause some undercutting under the first material.

Figure 6A:
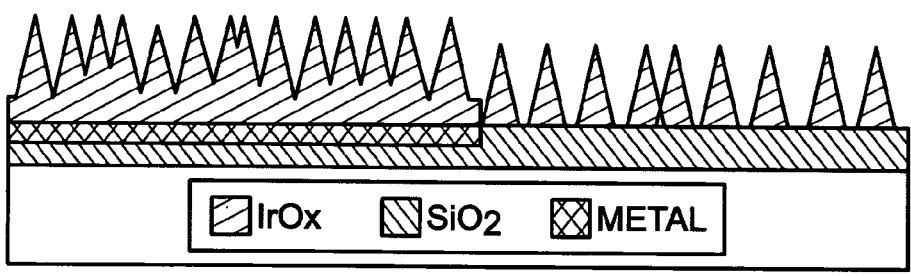
FIGS. 6A and 6B depict a second method for selectively etching IrOx nanostructures.
Figure 6B:
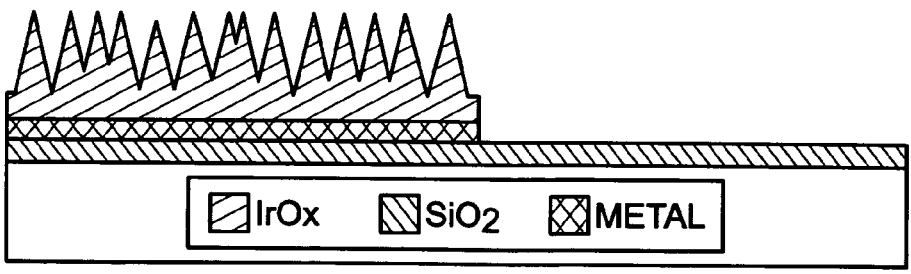

FIGS. 6A and 6B depict a second method for selectively etching IrOx nanostructures. After patterning the first material (i.e., Ti, TiN) layer, SiO2 is deposited by CVD and CMP is performed. The sidewall of the first material layer is protected by the SiO2 when the wafer is dipped into the HF solution. As a result, there is less likelihood of undercutting the first material.

For either method, a photoresist can be added overlying the nanostructures growing from the continuous film, when wafer is dipped in the HF solution. Then, the first material and IrOx nanostructures overlying the device region can be better protected from unintentional etching. In this manner, a faster acting, but less selective etchant can be used.

FIG. 7 is a flowchart illustrating a method for patterning IrOx nanostructures. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 forms a substrate first region adjacent a second region. Step 704 grows IrOx nanostructures from a continuous IrOx film overlying the first region. Step 706 simultaneously (with Step 704) grows IrOx nanostructures from a non-continuous IrOx film overlying the second region. Step 708 selectively etches areas of the second region exposed by the non-continuous IrOx film. Step 710 lifts off the IrOx nanostructures overlying the second region. Step 712, in response to lifting off the IrOx nanostructures overlying the second region, forms a substrate with nanostructures overlying the first region.

Typically, forming the substrate first region adjacent the second region (Step 702) includes forming the first region from a first material and the second region from a second material, different than the first material. For example, the first material can be Ti, TiN, TaN, Ta, Nb, W, WN, refractory metals, or refractory metal oxides. The second material can be SiOx. In another aspect, Step 702 forms the first material with a thickness in the range of 1 to 100 nanometers (nm).

In one aspect, selectively etching areas of the second region exposed by the non-continuous IrOx film (Step 708) includes exposing the substrate to an etchant that is more reactive with the second material than the IrOx. Ideally, the IrOx has no reaction with the etchant. For example, HF or buffered oxide etches (BOE) can be used. BOE is understood to be a mixture of HF with water or ammonium. For example, (NH(INF/4)F) is an example of BOE. If the second material is different than SiO2, another etchant might be used.

In one aspect, forming a substrate first region adjacent a second region in Step 702 includes substeps. Step 702a conformally deposits the second material overlying the first and second regions, and Step 702b selectively forms the first material overlying the second material in the first region, see FIGS. 5A and 5B. Alternately, Step 702c conformally deposits the second material overlying the first and second regions. Step 702d selectively forms the first material with a top surface overlying the second material in the first region. Step 702e conformally deposits the second material overlying the first and second regions. Step 702f chemical-mechanical polishes (CMPs) the second material to the level of the first material top surface, see FIGS. 6A and 6B.

In another aspect, simultaneously growing IrOx nanostructures from the non-continuous IrOx film overlying the second region (Step 706) includes forming non-continuous zones in the film having an area in the range between 100 $nm^2$ and 100 $microns^2$, and a spacing between zones in the range between 1 and 5000 nm.

In one aspect, growing IrOx nanostructures from the continuous IrOx film overlying the first region (Step 704) includes forming nanostructures having a diameter in the range between 10 and 1000 nm, a length in the range between 10 nm and 10 microns, and a spacing in the range between 10 and 1000 nm. Note, the nanostructures grown overlying the temporary non-continuous film have approximately the same dimensions.

A method for patterning a substrate of IrOx nanostructures, and a resulting patterned substrate have been provided. Examples of dimensions and materials have been used to help illustrate the invention. However, it should be understood that the invention is not limited to merely these examples. Other variations and embodiments of the invention will occur to those skilled in the art.

We claim:

1. A patterned iridium oxide (IrOx) nanostructure substrate, the patterned substrate comprising:
    a substrate with a first region and a second region adjoining the first region;
    a first material overlying the first region;
    a second material overlying the second region;
    a continuous IrOx film with grown IrOx nanostructures overlying the first material; and
    a non-continuous IrOx film with grown IrOx nanostructures temporarily overlying the second material.

2. The patterned substrate of claim 1 wherein the first material is different than the second material.

3. The patterned substrate of claim 2 wherein the first material is selected from the group including Ti, TiN, TaN, Ta, Nb, W, WN, refractory metals, and refractory metal oxides.

4. The patterned substrate of claim 2 wherein the first material has a thickness in the range of 1 to 100 nanometers (nm).

5. The patterned substrate of claim 2 wherein the second material is SiOx.

6. The patterned substrate of claim 2 wherein the second material overlies both the first and second regions of the substrate; and
    wherein the first material overlies the second material in the first region.

7. The patterned substrate of claim 2 wherein the second material overlies the first region of the substrate; and
    wherein the first material is formed overlying the second material, in the first region of the substrate.

8. The patterned substrate of claim 2 wherein the non-continuous IrOx film temporarily overlying the second region includes non-continuous zones in the film having an area in the range between 100 $nm^2$ and 100 $microns^2$, and a spacing between zones in the range between 10 and 5000 nm.

9. The patterned substrate of claim 2 wherein IrOx nanostructures grown from the continuous IrOx film overlying the first region have a diameter in the range between 10 and 1000 nm, a length in the range between 10 nm and 10 microns, and a spacing in the range between 10 and 1000 nm.

10. A patterned iridium oxide (IrOx) nanostructure substrate, the patterned substrate comprising:
    a substrate with a first region and a second region adjoining the first region;
    a first material overlying the first region;
    a second material overlying the second region; and
    a continuous IrOx film with grown IrOx nanostructures, having an aspect ratio in the range of 1:1 and 100:1, overlying the first material.

11. The patterned substrate of claim 10 wherein the first material is different than the second material.

12. The patterned substrate of claim 11 wherein the first material is selected from the group including Ti, TiN, TaN, Ta, Nb, W, WN, refractory metals, and refractory metal oxides.

13. The patterned substrate of claim 11 wherein the second material is SiOx.

14. The patterned substrate of claim 11 wherein the second material overlies both the first and second regions of the substrate; and wherein the first material overlies the second material in the first region.

15. The patterned substrate of claim 11 wherein the second material overlies the first region of the substrate; and wherein the first material is formed overlying the second material, in the first region of the substrate.

16. The patterned substrate of claim 11 wherein IrOx nanostructures grown from the continuous IrOx film overlying the first region have a diameter in the range between 10 and 1000 nm, a length in the range between 10 nm and 10 microns, and a spacing in the range between 10 and 1000 nm.

* * * * *